(12) United States Patent
Han et al.

(10) Patent No.: US 12,532,648 B2
(45) Date of Patent: Jan. 20, 2026

(54) DISPLAY DEVICE

(71) Applicant: Samsung Display Co., LTD., Yongin-si (KR)

(72) Inventors: Sang-Woo Han, Yongin-si (KR); Sungwoo Eo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 219 days.

(21) Appl. No.: 18/209,125

(22) Filed: Jun. 13, 2023

(65) Prior Publication Data

US 2023/0413652 A1 Dec. 21, 2023

(30) Foreign Application Priority Data

Jun. 17, 2022 (KR) .......................... 10-2022-0074238

(51) Int. Cl.
H10K 59/80 (2023.01)

(52) U.S. Cl.
CPC .................. H10K 59/8792 (2023.02)

(58) Field of Classification Search
CPC .. H10K 59/8792; H10K 59/871; H10K 59/50; H10K 50/84; H10K 50/865; H10K 77/111; H10K 2102/311; G09F 9/335
See application file for complete search history.

(56) References Cited

U.S. PATENT DOCUMENTS

| | | | |
|---|---|---|---|
| 11,152,435 B2* | 10/2021 | Ryu | H10K 59/8794 |
| 11,163,337 B2 | 11/2021 | Shin | |
| 11,367,771 B2* | 6/2022 | Lee | H10K 59/131 |
| 2004/0028895 A1 | 2/2004 | Yamakami et al. | |
| 2020/0219948 A1* | 7/2020 | Kim | H10K 59/65 |
| 2020/0264668 A1 | 8/2020 | Baek et al. | |
| 2020/0395433 A1* | 12/2020 | Sung | H10K 59/126 |
| 2021/0384476 A1 | 12/2021 | Sim et al. | |
| 2022/0020940 A1 | 1/2022 | Park et al. | |
| 2022/0059806 A1* | 2/2022 | Ko | H10K 59/8792 |

FOREIGN PATENT DOCUMENTS

| | | |
|---|---|---|
| KR | 100987679 B1 | 10/2010 |
| KR | 1020200028063 A | 3/2020 |
| KR | 1020200099632 A | 8/2020 |
| KR | 1020210153495 A | 12/2021 |
| KR | 1020220009544 A | 1/2022 |

* cited by examiner

*Primary Examiner* — Kevin Quarterman
(74) *Attorney, Agent, or Firm* — CANTOR COLBURN LLP

(57) ABSTRACT

A display device includes a display panel displaying an image, a support plate supporting the display panel, and an adhesive layer disposed between the display panel and the support plate to attach the display panel to the support plate. The support plate includes a support layer and a shielding layer disposed on the support layer, and the shielding layer includes a light-blocking layer and a reflective layer disposed between the light-blocking layer and the support layer.

19 Claims, 10 Drawing Sheets

DISPLAY DEVICE

This application claims priority to Korean Patent Application No. 10-2022-0074238, filed on Jun. 17, 2022, and all the benefits accruing therefrom under 35 U.S.C. § 119, the content of which in its entirety is herein incorporated by reference.

BACKGROUND

1. Field

The disclosure relates to a display device. More particularly, the disclosure relates to a display device having a function of preventing an external light from being reflected.

2. Description of the Related Art

Various display devices that are applied to multimedia devices, such as televisions, mobile phones, tablet computers, navigation devices, and game devices, are being developed. In recent years, a foldable or rollable display device with a flexible display member is being developed to facilitate portability and to improve a user's convenience.

Recently, the display device employs a structure in which a support plate is disposed under a display panel to improve an impact resistance.

SUMMARY

The disclosure provides a display device with improved low-reflection characteristics while employing a support plate.

An embodiment of the inventive concept provides a display device including a display panel which displays an image, a support plate supporting the display panel, and an adhesive layer disposed between the display panel and the support plate. The support plate includes a support layer and a shielding layer disposed on the support layer. The shielding layer includes a light-blocking layer and a reflective layer disposed between the light-blocking layer and the support layer.

In an embodiment, the light-blocking layer includes a first absorbing layer and a second absorbing layer, which are sequentially stacked, and the first absorbing layer and the second absorbing layer include different materials from each other.

In an embodiment, the first absorbing layer has a thickness greater than a thickness of the second absorbing layer in a thickness direction.

In an embodiment, the reflective layer has an extinction coefficient greater than an extinction coefficient of the light-blocking layer.

In an embodiment, the second absorbing layer has an extinction coefficient greater than an extinction coefficient of the first absorbing layer.

In an embodiment, the reflective layer has an extinction coefficient greater than an extinction coefficient of the second absorbing layer.

In an embodiment, the reflective layer has a thickness greater than a thickness of the light-blocking layer in a thickness direction, and the reflective layer has a refractive index smaller than a refractive index of the light-blocking layer.

In an embodiment, the reflective layer includes a metal material and has a reflectance higher than a reflectance of the light-blocking layer.

In an embodiment, the support plate further includes a protective layer disposed between the shielding layer and the adhesive layer.

In an embodiment, the protective layer has an extinction coefficient smaller than an extinction coefficient of the shielding layer, and the protective layer has a refractive index smaller than a refractive index of the adhesive layer.

In an embodiment, the protective layer includes an oxide.

In an embodiment, the protective layer has a thickness greater than a thickness of the shielding layer in a thickness direction.

In an embodiment, the support layer includes a metal material.

In an embodiment, the display panel includes a folding area and a non-folding area, and the non-folding area includes a first non-folding area and a second non-folding area.

In an embodiment, the support plate overlaps the first non-folding area and the second non-folding area.

An embodiment of the inventive concept provides a display device including a display panel which displays an image, a support plate supporting the display panel, and an adhesive layer disposed between the display panel and the support plate. The support plate includes a support layer, a shielding layer disposed on the support layer, and a protective layer disposed between the shielding layer and the adhesive layer.

In an embodiment, the protective layer includes an oxide.

In an embodiment, the shielding layer includes a first absorbing layer and a second absorbing layer, and the first absorbing layer and the second absorbing layer include different materials from each other.

In an embodiment, the shielding layer further includes a reflective layer disposed between the second absorbing layer and the support layer.

In an embodiment, the reflective layer has an extinction coefficient greater than an extinction coefficient of the second absorbing layer.

According to the above, the support plate disposed under the display panel has the function of preventing the external-light reflection, and thus, a separate shielding member is not desired between the display panel and the support plate. Accordingly, the overall thickness of the display device is reduced.

In addition, since the support plate further includes the reflective layer disposed on the support layer, even though stains exist on a surface of the support layer, the stains are prevented from being viewed.

BRIEF DESCRIPTION OF THE DRAWINGS

The above and other advantages of the disclosure will become readily apparent by reference to the following detailed description when considered in conjunction with the accompanying drawings, in which.

DETAILED DESCRIPTION

Figure 1:
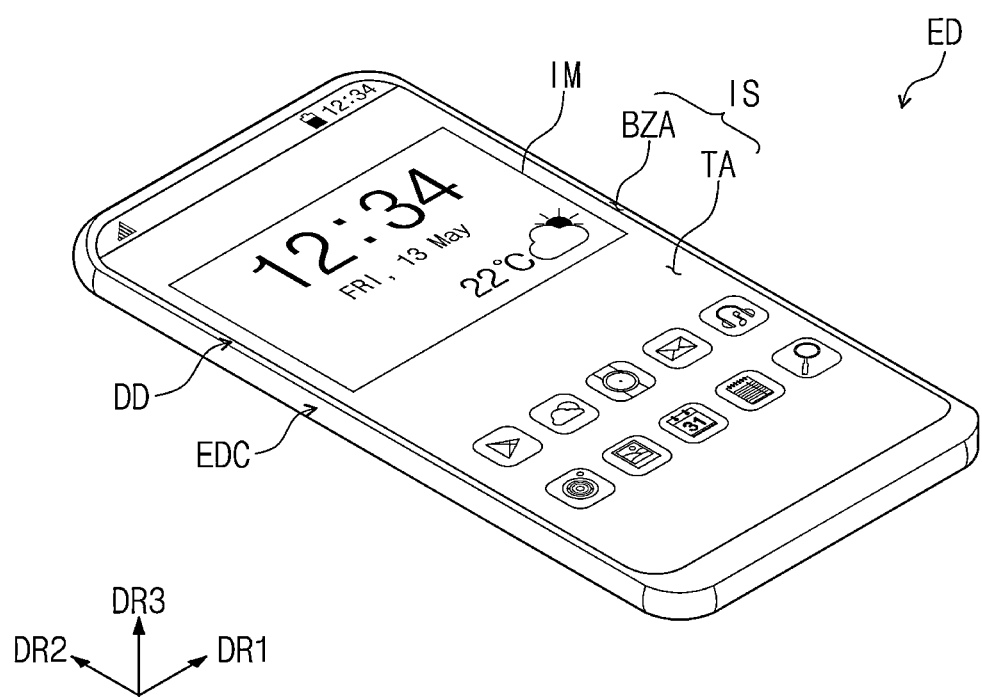
FIG. 1 is a perspective view of an embodiment of an electronic device according to the disclosure.

The disclosure may be variously modified and realized in many different forms, and thus illustrative embodiments will be exemplified in the drawings and described in detail hereinbelow. However, the disclosure should not be limited to the specific disclosed forms, and be construed to include all modifications, equivalents, or replacements included in the spirit and scope of the disclosure.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the drawing figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the disclosure will be described with reference to accompanying drawings.

Figure 2:
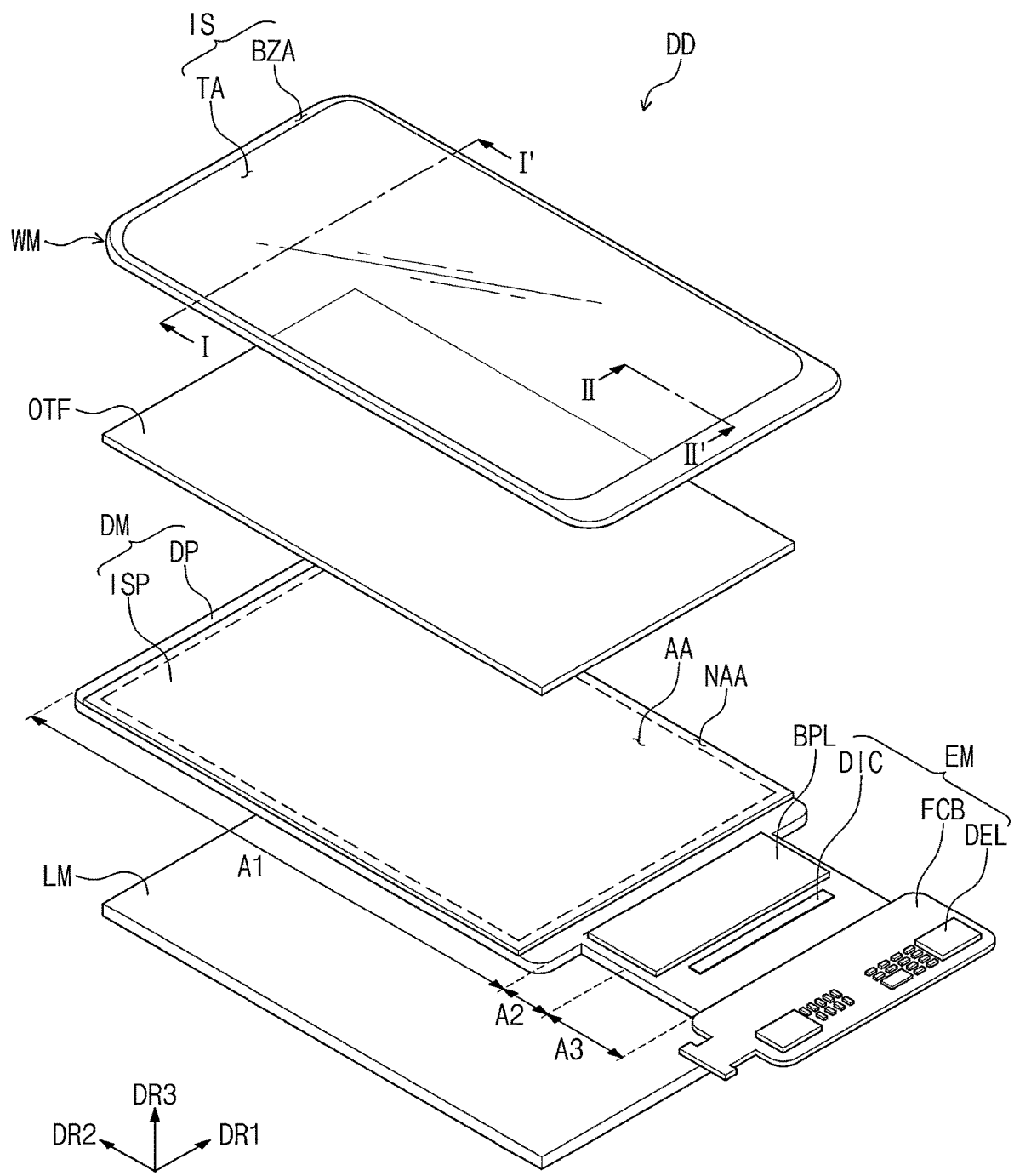
FIG. 2 is an exploded perspective view of an embodiment of a display device according to the disclosure.
Figure 3:
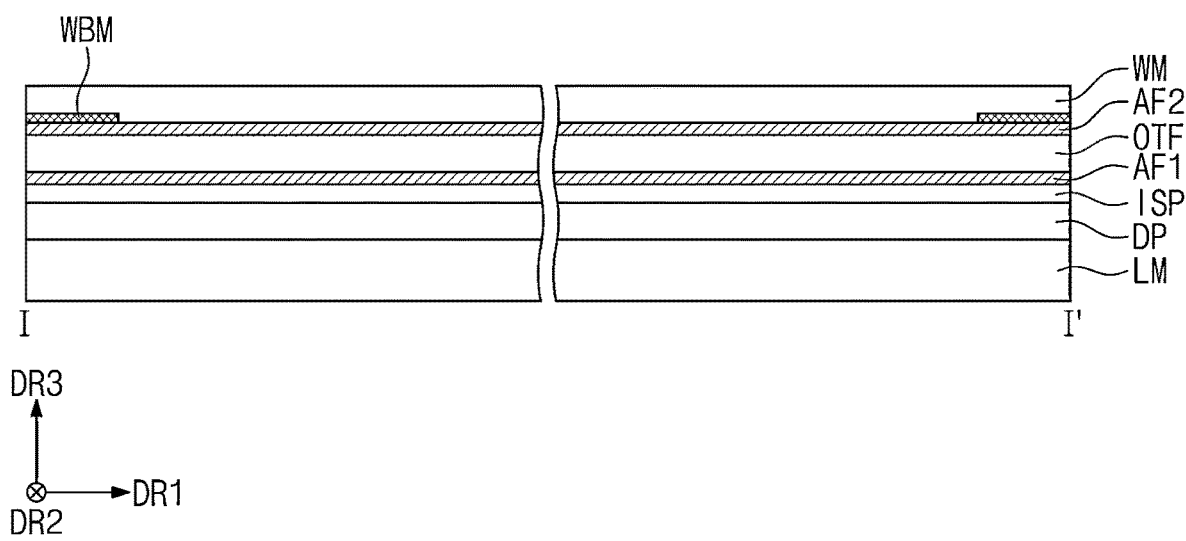
FIG. 3 is a cross-sectional view taken along line I-I' of FIG. 2.

FIG. 1 is a perspective view of an embodiment of an electronic device ED according to the disclosure, and FIG. 2 is an exploded perspective view of an embodiment of a display device DD according to the disclosure. FIG. 3 is a cross-sectional view taken along line I-I' of FIG. 2.

Referring to FIGS. 1 to 3, the electronic device ED may be activated in response to electrical signals. The electronic device ED may be applied to various embodiments. In an embodiment, the electronic device ED may be applied to electronic devices, such as a smart watch, a tablet computer, a notebook computer, a computer, or a smart television, for example.

The electronic device ED may display an image IM toward a third direction (also referred to as a thickness direction) DR3 through a display surface IS substantially parallel to each of a first direction DR1 and a second direction DR2. The display surface IS through which the image IM is displayed may correspond to a front surface of the electronic device ED. The image IM may include a still image as well as a moving image.

In the illustrated embodiment, front (or upper) and rear (or lower) surfaces of each member may be defined with respect to the third direction DR3 in which the image IM is displayed. The front and rear surfaces may be opposite to each other in the third direction DR3, and a normal line direction of each of the front and rear surfaces may be substantially parallel to the third direction DR3.

A separation distance in the third direction DR3 between the front surface and the rear surface may correspond to a thickness in the third direction DR3 of the electronic device ED. Directions indicated by the first, second, and third directions DR1, DR2, and DR3 are relative to each other, and thus, the directions indicated by the first, second, and third directions DR1, DR2, and DR3 may be changed to other directions.

The electronic device ED may sense an external input applied thereto from the outside. The external input may include inputs of various forms provided from the outside of the electronic device ED. In an embodiment, the external input may include external inputs applied when in proximity to or approaching close to the electronic device ED at a predetermined distance (e.g., a hovering input) as well as a touch input by a user's body, e.g., a hand of a user. In addition, the external input may include various forms, such as force, pressure, temperature, or light.

The front surface of the electronic device ED may be divided into a transmission area TA and a bezel area BZA. The image IM may be displayed through the transmission area TA. The user may view the image IM through the transmission area TA. In the illustrated embodiment, the transmission area TA may have a quadrangular shape with rounded vertices. However, this is merely one of embodiments, and the transmission area TA may have a variety of shapes and should not be particularly limited.

The bezel area BZA may be defined adjacent to the transmission area TA. The bezel area BZA may have a predetermined color. The bezel area BZA may surround the transmission area TA. Accordingly, the shape of the transmission area TA may be defined by the bezel area BZA, however, this is merely one of embodiments. That is, the bezel area BZA may be disposed adjacent to only one side of the transmission area TA or may be omitted. The display device DD in the embodiment of the disclosure may be implemented in various embodiments, and it should not be particularly limited.

The electronic device ED may include the display device DD and an external case EDC. The display device DD may include a window WM, a display module DM, a driving module EM, an optical film OTF, and a lower module LM.

The window WM may include a transparent material through which an image transmits. In an embodiment, the window WM may include glass, sapphire, or plastic. The window WM is shown as a single layer, however, it should not be limited thereto or thereby. The window WM may include plural layers. Although not shown in drawing figures, the bezel area BZA of the display device DD may be obtained by printing a material having the predetermined color on an area of the window WM. In an embodiment, the window WM may include a bezel pattern WBM to define the bezel area BZA. The bezel pattern WBM may be a colored organic layer and may be formed by a coating method.

The display module DM may include a display panel DP and an input sensing layer ISP. The display panel DP in the embodiment of the disclosure may be a light-emitting type display panel, however, it should not be particularly limited. In an embodiment, the display panel DP may be an organic light-emitting display panel, an inorganic light-emitting display panel, or a quantum dot light-emitting display panel, for example. A light-emitting layer of the organic light-emitting display panel may include an organic light-emitting material. A light-emitting layer of the inorganic light-emitting display panel may include an inorganic light-emitting material. A light-emitting layer of the quantum dot light-emitting display panel may include a quantum dot and a quantum rod. Hereinafter, the organic light-emitting display panel will be described as an illustrative embodiment of the display panel DP.

The input sensing layer ISP may be disposed directly on the display panel DP. According to the embodiment, the input sensing layer ISP may be formed on the display panel DP through successive processes. That is, when the input sensing layer ISP is disposed directly on the display panel DP, an adhesive film may not be disposed between the input sensing layer ISP and the display panel DP.

The display panel DP may generate the image IM, and the input sensing layer ISP may obtain coordinate information about the external input, e.g., a touch event.

The optical film OTF may reduce a reflectance with respect to an external light incident thereto from the above of the window WM. The optical film OTF in the embodiment of the disclosure may include a retarder and a polarizer. The retarder may be a film type or liquid crystal coating type and may include a 212 retarder and/or a 214 retarder. The polarizer may be a film type or liquid crystal coating type. The film type retarder and polarizer may include a stretching type synthetic resin film, and the liquid crystal coating type retarder and polarizer may include liquid crystals aligned in a predetermined alignment. The retarder and the polarizer may be implemented as one polarizing film. In this case, the optical film OTF may further include a protective film disposed on or under the polarizing film.

The optical film OTF may be disposed on the input sensing layer ISP. That is, the optical film OTF may be disposed between the input sensing layer ISP and the window WM. The input sensing layer ISP, the optical film OTF, and the window WM may be coupled to each other by an adhesive film. Referring to FIG. 3, a first adhesive film AF1 may be disposed between the input sensing layer ISP and the optical film OTF, and a second adhesive film AF2 may be disposed between the optical film OTF and the window WM. Accordingly, the optical film OTF may be coupled to the input sensing layer ISP by the first adhesive film AF1, and the window WM may be coupled to the optical film OTF by the second adhesive film AF2.

In an embodiment, each of the first and second adhesive films AF1 and AF2 may be an optically clear adhesive ("OCA") film. However, materials for the first and second adhesive films AF1 and AF2 should not be limited thereto or thereby and may include a conventional adhesive. In an embodiment, each of the first and second adhesive films AF1 and AF2 may include a pressure sensitive adhesive ("PSA"), an OCA, or an optically clear resin ("OCR"), for example.

A functional layer, e.g., a protective layer, that performs another function may be further disposed between the display module DM and the window WM in addition to the optical film OTF.

The display module DM may display the image in response to electrical signals and may transmit/receive information about the external input. The display module DM may include an active area AA and a peripheral area NAA. The active area AA may be defined as an area through which the image provided from the display module DM transmits.

The peripheral area NAA may be defined adjacent to the active area AA. In an embodiment, the peripheral area NAA may surround the active area AA. However, this is merely one of embodiments, and the peripheral area NAA may be defined in various shapes and should not be particularly limited, for example. In an embodiment, the active area AA of the display module DM may correspond to at least a portion of the transmission area TA.

According to the disclosure, the display module DM may include a first area A1, a second area A2, and a third area A3, which are arranged in a direction opposite to the second direction DR2. The first area A1 may correspond to the display surface IS. The second area A2 and the third area A3 may correspond to the peripheral area NAA. The second area A2 may be a bending area bent with respect to a bending axis, and each of the first area A1 and the third area A3 may be a non-bending area.

A length of each of the second area A2 and the third area A3 in the first direction DR1 may be equal to or smaller than a length of the first area A1 in the first direction DR1. An area with a relatively short length in a direction parallel to the bending axis may be easily bent.

The display device DD may further include a bending protective layer BPL disposed in the second area A2 of the display module DM. The bending protective layer BPL may be further disposed in a portion of the first area A1 and a portion of the third area A3. The bending protective layer BPL may be bent together with the second area A2. The bending protective layer BPL may protect the second area A2 from external impacts and may control a neutral surface of the second area A2. The bending protective layer BPL may control stress of the second area A2 such that the neutral surface may be closer to signal lines disposed in the second area A2.

The driving module EM may control a drive of the display module DM. The driving module EM may include a flexible circuit film FCB and a driving chip DIC. The flexible circuit film FCB may be electrically connected to the display panel DP. The flexible circuit film FCB may be coupled to an end of the third area A3 of the display module DM by a bonding process. The flexible circuit film FCB may be electrically connected to the display module DM by an anisotropic conductive adhesive layer. The driving chip DIC may be disposed (e.g., mounted) in the third area A3 of the display module DM. The driving chip DIC may include driving circuits, e.g., a data driving circuit, to drive a pixel of the display panel DP.

The driving module EM may further include a plurality of driving elements DEL disposed (e.g., mounted) on the flexible circuit films FCB. The driving elements DEL may include a circuit unit to convert a signal input from the outside into a signal desired for the driving chip DIC or into a signal desired to drive the display module DM. When the second area A2 of the display module DM is bent, the flexible circuit film FCB may be disposed under the display module DM.

The lower module LM may be disposed on a rear surface of the display module DM. The lower module LM disposed on the rear surface of the display module DM may improve an impact resistance of the display device DD. The lower module LM may be fixed to the rear surface of the display module DM by an adhesive film. The adhesive film may be a PSA, an OCA, or an OCR. When the second area A2 of the display module DM is bent, the third area A3 of the display module DM and the flexible circuit film FCB may be disposed on a rear surface of the lower module LM.

The external case EDC may accommodate the display device DD. The external case EDC may be coupled to the window WM to define an appearance of the electronic device ED. The external case EDC may absorb external impacts applied thereto from the outside and may prevent a foreign substance/moisture from entering the electronic device ED, and thus, components accommodated in the external case EDC may be protected by the external case EDC. In an embodiment, the external case EDC may have a structure in which plural accommodation members are coupled to each other.

Figure 4:
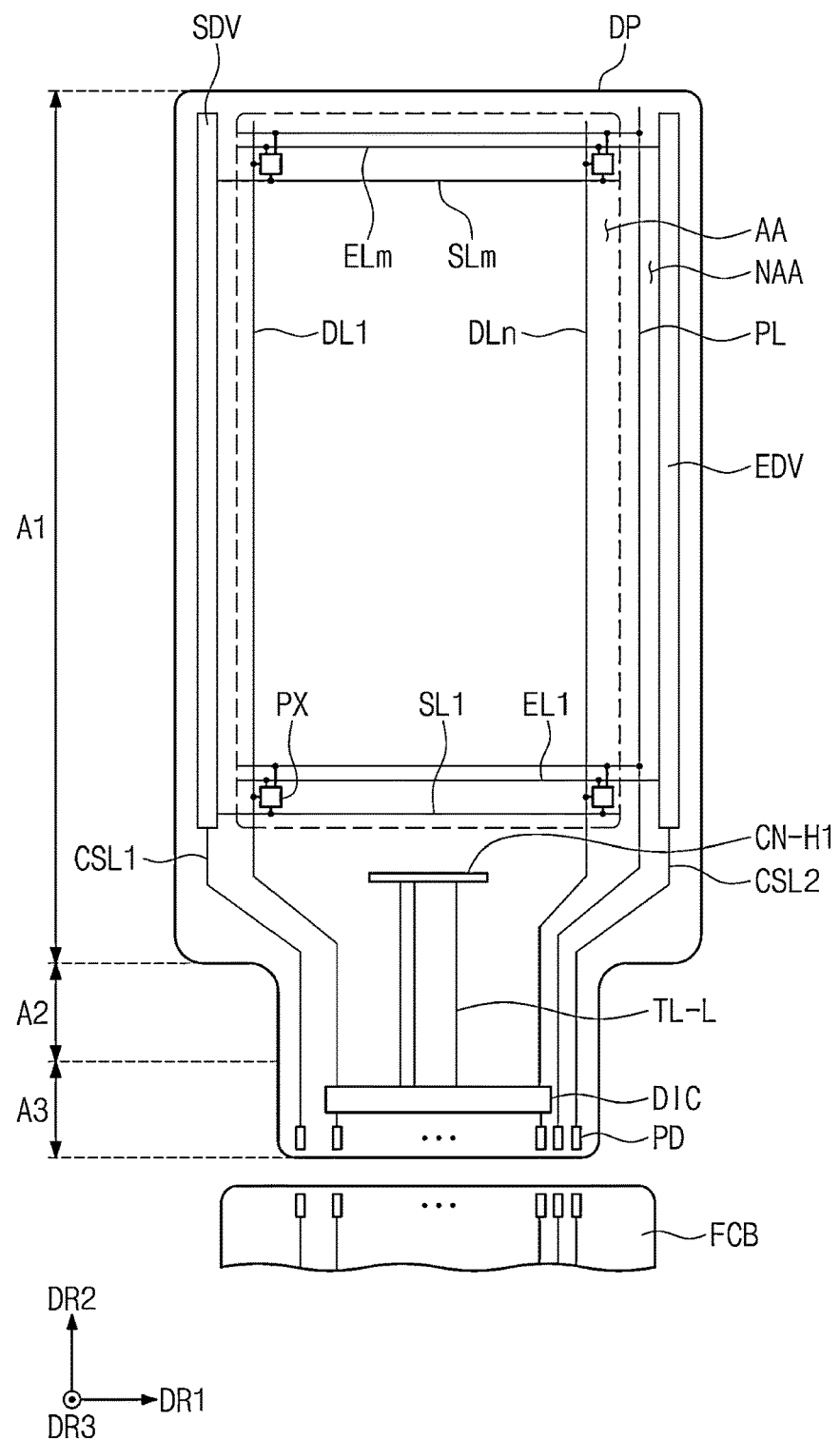
FIG. 4 is a plan view of an embodiment of a display panel according to the disclosure.

FIG. 4 is a plan view of an embodiment of the display panel DP according to the disclosure.

Referring to FIGS. 2 and 4, the display panel DP may include a first area A1, a second area A2, and a third area A3. The first, second, and third areas A1, A2, and A3 of the display panel DP shown in FIG. 4 may respectively correspond to the first, second, and third areas A1, A2, and A3 of the display module DM described with reference to FIG. 2. In the disclosure, the expression "an area/portion corresponds to another area/portion" means that "an area/portion overlaps another area/portion", and the areas and the portions should not be limited to having the same size as each other.

The display panel DP may include an active area AA in which the pixel PX is disposed and a peripheral area NAA adjacent to the active area AA. The active area AA and the peripheral area NAA may respectively correspond to the active area AA and the peripheral area NAA, which are described with reference to FIG. 2. The active area AA may correspond to an area of the first area A1 in which the pixel PX is disposed, and the peripheral area NAA may include the other area of the first area A1 except the area in which the pixel PX is disposed, the second area A2, and the third area A3.

The display panel DP may include a scan driver SDV, an emission driver EDV, and the driving chip DIC, which are disposed in the peripheral area NAA. The driving chip DIC may be the data driver.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, and a plurality of pads PD. Each of m and n may be a natural number. The pixels PX may be connected to the scan lines SL1 to SLm, the data lines DL1 to DLn, and the emission lines EL1 to ELm.

The scan lines SL1 to SLm may extend in the first direction DR1 to be connected to the scan driver SDV. The data lines DL1 to DLn may extend in the second direction DR2 from the first area A1 to the third area A3 via the second area A2 to be connected to the driving chip DIC disposed in the third area A3. The emission lines EL1 to ELm may extend in the first direction DR1 and may be connected to the emission driver EDV.

The power line PL may include a portion extending in the first direction DR1 and a portion extending in the second direction DR2. The portion extending in the first direction DR1 and the portion extending in the second direction DR2 may be disposed in different layers from each other. The portion of the power line PL, which extends in to the second direction DR2, may extend from the third area A3 to the first area A1 via the second area A2. The power line PL may apply a reference voltage to the pixels PX.

The first control line CSL1 may be connected to the scan driver SDV and may extend from the first area A1 to the third area A3 via the second area A2. The second control line CSL2 may be connected to the emission driver EDV and may extend from the first area A1 to the third area A3 via the second area A2.

In a plan view, the pads PD may be disposed adjacent to an end of the third area A3. The driving chip DIC, the power line PL, the first control line CSL1, and the second control line CSL2 may be connected to the pads PD. The flexible circuit film (hereinafter also referred to as a flexible circuit board) FCB may be disposed on the display panel DP to overlap the end of the third area A3 of the display panel DP. The flexible circuit board FCB may include pads corresponding to the pads PD and may be electrically connected to the pads PD by an anisotropic conductive adhesive layer.

A first contact hole CN-H1 may be defined in the first area A1. The display panel DP may include extension-sensing lines TL-L extending from the first contact hole CN-H1 to the third area A3 via the first area A1 and the second area A2. The extension-sensing lines TL-L may be connected to corresponding sensing lines among sensing lines TL1, TL2, and TL3 described later in a one-to-one correspondence.

FIG. 4 shows a structure in which the extension-sensing lines TL-L are disposed between the data lines DL1 to DLn, however, the disclosure should not be limited thereto or thereby. In an embodiment, the data lines DL1 to DLn may be disposed between the extension-sensing lines TL-L, and thus, the first contact hole CN-H1 may be provided in plural with the data lines DL1 to DLn interposed therebetween. However, the disclosure should not be particularly limited.

Figure 5:
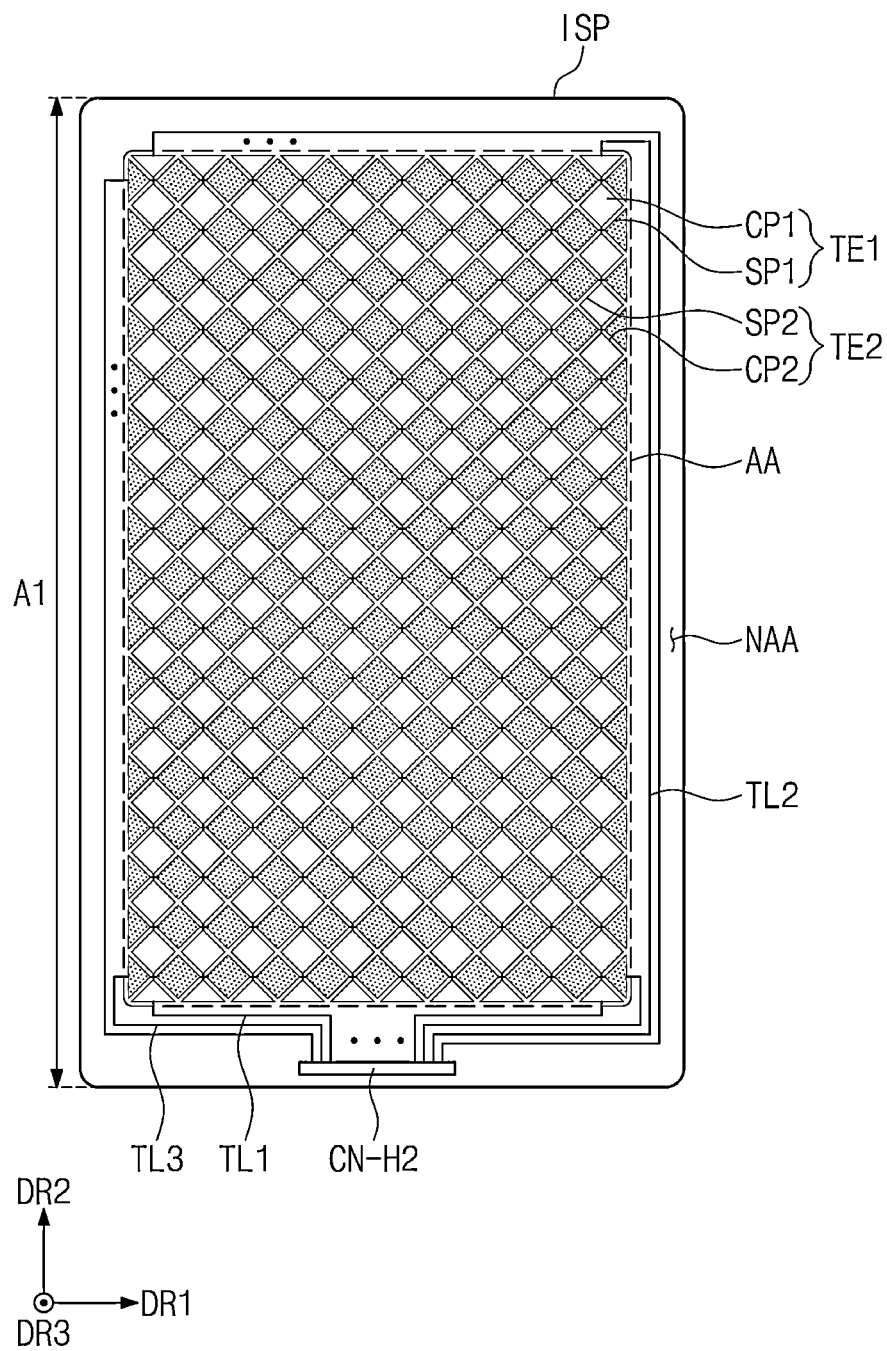
FIG. 5 is a plan view of an embodiment of an input sensing layer according to the disclosure.

FIG. 5 is a plan view of an embodiment of the input sensing layer ISP according to the disclosure.

Referring to FIG. 5, the input sensing layer ISP may include sensing electrodes TE1 and TE2 and the sensing lines TL1, TL2, and TL3. In a case where the input sensing layer ISP is formed directly on the display panel DP through successive processes, the input sensing layer ISP may be formed only in an area overlapping the first area A1 of the display panel DP.

The input sensing layer ISP may obtain information about the external input based on a variation in capacitance between first sensing electrodes TE1 and second sensing electrodes TE2. The first sensing electrodes TE1 may be arranged in the first direction DR1 and may extend in the second direction DR2. Each of the first sensing electrodes TE1 may include a first sensing pattern SP1 and a first connection pattern CP1.

The first sensing pattern SP1 may be disposed in the active area AA. The first sensing pattern SP1 may have a lozenge shape, however, this is merely one of embodiments. In an embodiment, the first sensing pattern SP1 may have a variety of shapes, and it should not be particularly limited.

The first connection pattern CP1 may be disposed in the active area AA. The first connection pattern CP1 may be disposed between the first sensing patterns adjacent to each other. The first connection pattern CP1 may be disposed in a layer different from a layer in which the first sensing pattern SP1 is disposed and may be connected to the first sensing pattern SP1 via a contact hole.

The second sensing electrodes TE2 may be arranged in the second direction DR2 and may extend in the first direction DR1. Each of the second sensing electrodes TE2 may include a second sensing pattern SP2 and a second connection pattern CP2.

The second sensing pattern SP2 may be spaced apart from the first sensing pattern SP1. The first sensing pattern SP1 and the second sensing pattern SP2 may not contact each other and may transmit and receive independent electrical signals.

The second sensing pattern SP2 may have substantially the same shape as that of the first sensing pattern SP1. In an embodiment, the second sensing pattern SP2 may have the lozenge shape, for example, however, this is merely one of embodiments. In an embodiment, the second sensing pattern SP2 may have a variety of shapes, and it should not be particularly limited.

The second connection pattern CP2 may be disposed between the second sensing patterns adjacent to each other. For the convenience of explanation, the second sensing electrode TE2 is described as being divided into the second sensing pattern SP2 and the second connection pattern CP2, however, the second sensing electrode TE2 may be provided as substantially one pattern.

In an embodiment, the second sensing electrode TE2 may be disposed in the same layer as the first sensing pattern SP1, and in this case, the first sensing pattern SP1 and the second sensing electrode TE2 may be provided as a plurality of mesh lines extending in an oblique direction of each of the first direction DR1 and the second direction DR2.

The sensing lines TL1, TL2, and TL3 may be disposed in the peripheral area NAA. The sensing lines TL1, TL2, and TL3 may include first sensing lines TL1, second sensing lines TL2, and third sensing lines TL3.

The first sensing lines TL1 may be connected to the first sensing electrodes TE1, respectively. In the illustrated embodiment, the first sensing lines TL1 may be connected to lower ends of opposite ends of the first sensing electrodes TE1, respectively. The second sensing lines TL2 may be connected to upper ends of the opposite ends of the first sensing electrodes TE1, respectively. According to the disclosure, each of the first sensing electrodes TE1 may be connected to a corresponding first sensing line among the first sensing lines TL1 and a corresponding second sensing line among the second sensing lines TL2. Accordingly, a sensitivity of the first sensing electrodes TE1, which have a relatively longer length compared with that of the second sensing electrodes TE2, may be uniformly maintained over the area of the first sensing electrodes TE1.

This is merely one of embodiments. In an embodiment, the second sensing lines TL2 of the input sensing layer ISP may be omitted, and the disclosure should not be particularly limited.

The third sensing lines TL3 may be connected to one ends of the second sensing electrodes, respectively. In the illustrated embodiment, the third sensing lines TL3 may be connected to left ends of opposite ends of the second sensing electrodes TE2, respectively.

Referring to FIGS. 4 and 5, a second contact hole CN-H2 overlapping the peripheral area NAA may be defined in the input sensing layer ISP. The second contact hole CN-H2 may overlap the first contact hole CN-H1 of the display panel DP. The sensing lines TL1, TL2, and TL3 may be connected to corresponding extension sensing lines TL-L via the second contact hole CN-H2 defined through the input sensing layer ISP and the first contact hole CN-H1 defined through the display panel DP. Accordingly, the sensing electrodes TE1 and TE2 may be connected to the flexible circuit board FCB.

Figure 6:
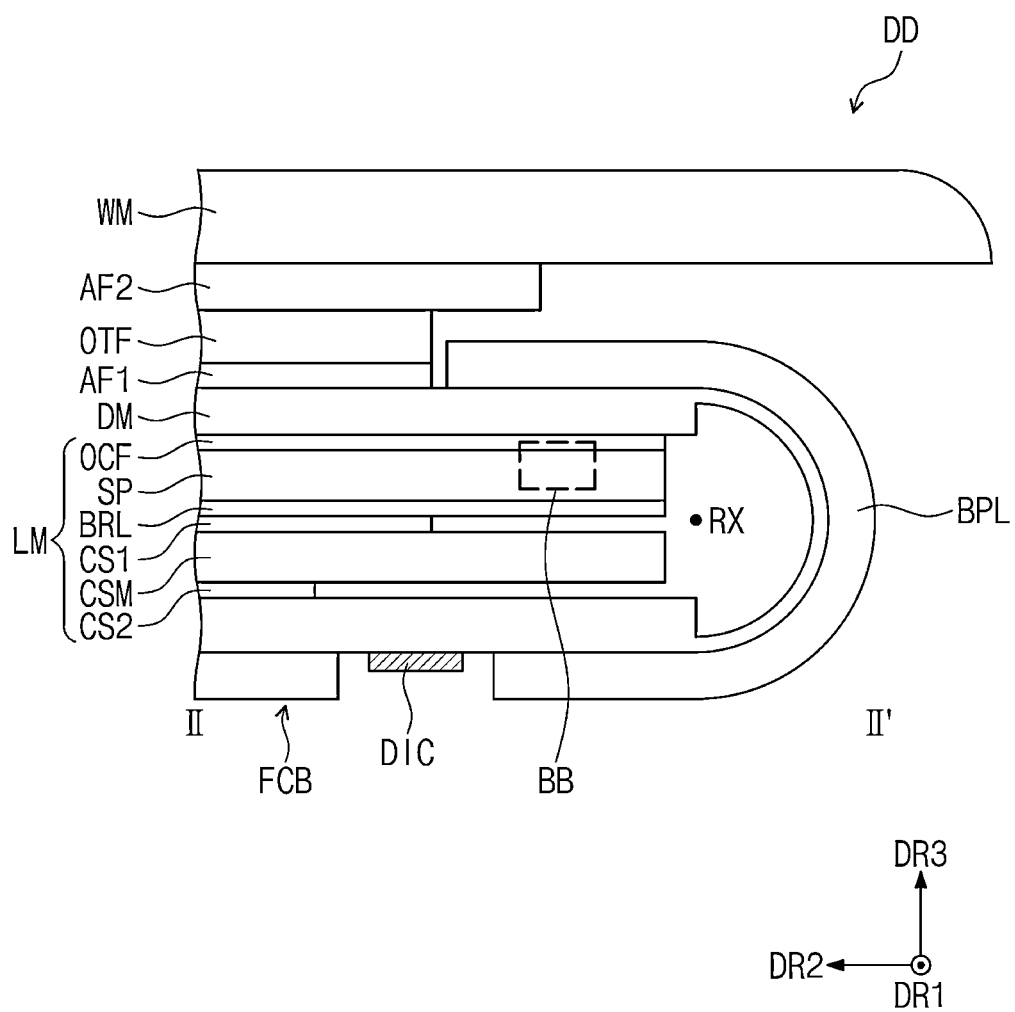
FIG. 6 is a cross-sectional view taken along line II-IF of FIG. 2.

FIG. 6 is a cross-sectional view taken along line II-IF of FIG. 2.

Referring to FIGS. 2 and 6, the second area A2 of the display module DM may be bent with respect to the bending axis RX and may be disposed on the rear surface of the lower module LM. The bending protective layer BPL may be disposed on the display module DM in the second area A2 and may be bent in the second area A2. One end of the flexible circuit film FCB may be coupled with the display module DM in the third area A3 by a bonding process. The driving chip DIC may be disposed (e.g., mounted) on the display module DM in the third area A3.

The bending protective layer BPL may be coupled with the display module DM. The bending protective layer BPL may be disposed in second area A2 of the display module DM. Accordingly, the bending protective layer BPL may protect the display module DM in the second area A2.

In an embodiment, the display module DM may be bent with respect to the bending axis RX in the second area A2. In an embodiment, the bending axis RX may extend in the first direction DR1, and the driving chip DIC may have a shape extending in the first direction DR1.

The lower module LM may include a support plate SP disposed under the display module DM and an adhesive layer OCF disposed between the support plate SP and the display module DM. The support plate SP may be attached to the display module DM by the adhesive layer OCF.

The support plate SP may be disposed on the rear surface of the display panel DP and may support the display panel DP. The support plate SP may be a protective plate that absorbs external impacts applied thereto from the outside or prevents a foreign substance or moisture from entering the display panel DP to protect the display panel DP.

The adhesive layer OCF may include an optically transparent adhesive material. In an embodiment, the adhesive layer OCF may include a PSA, an OCA, or an OCR.

The lower module LM may further include a barrier layer BRL, a first functional layer CS1, a cover support plate CSM, and a second functional layer CS2, which are sequentially stacked one another.

The barrier layer BRL may be disposed under the display module DM that is bent. The barrier layer BRL may increase a resistance to a compressive force caused by external pressure. Accordingly, the barrier layer BRL may prevent the display module DM from being deformed. The barrier layer BRL may include a flexible plastic material, such as polyimide or polyethylene terephthalate. In addition, the barrier layer BRL may be a colored film with relatively low light transmittance. The barrier layer BRL may absorb a light incident thereto from the outside. In an embodiment, the barrier layer BRL may be a black synthetic resin film. Accordingly, when looking at the display device DD from the above of the window WM, components disposed under the barrier layer BRL may not be visible to the user. Although not shown in drawing figures, the barrier layer BRL may be coupled with the first functional layer CS1 by an adhesive film.

The first functional layer CS1 may prevent the display panel DP from being damaged during a manufacturing process of the display panel DP. The first functional layer CS1 may be a colored polyimide film. In an embodiment, the first functional layer CS1 may be an opaque yellow film, however, the illustrated embodiment should not be limited thereto or thereby.

The cover support plate CSM may have an easy bending property. Accordingly, the cover support plate CSM may include a plastic material, a metal alloy, or the like. Although not shown in drawing figures, the cover support plate CSM may further include a functional layer (e.g., a heat dissipation layer), in addition to the function of absorbing external impacts or the function of protecting the display panel DP.

The second functional layer CS2 may increase the impact resistance of the display device DD. The second functional layer CS2 may have a single-layer or multi-layer structure. The second functional layer CS2 may include at least one of a barrier film and a cushion layer. In the case where the second functional layer CS2 includes the barrier film, the barrier film may include a synthetic resin film.

The window WM may be disposed on the display module DM. The optical film OTF may be disposed between the window WM and the display module DM. The optical film OTF may be coupled with the display module DM by the first adhesive film AF1, and the window WM may be coupled with the optical film OTF by the second adhesive film AF2. In an embodiment, the optical film OTF may not overlap the bending protective layer BPL. That is, the optical film OTF may be spaced apart from one end of the bending protective layer BPL in the second direction DR2.

Figure 7:
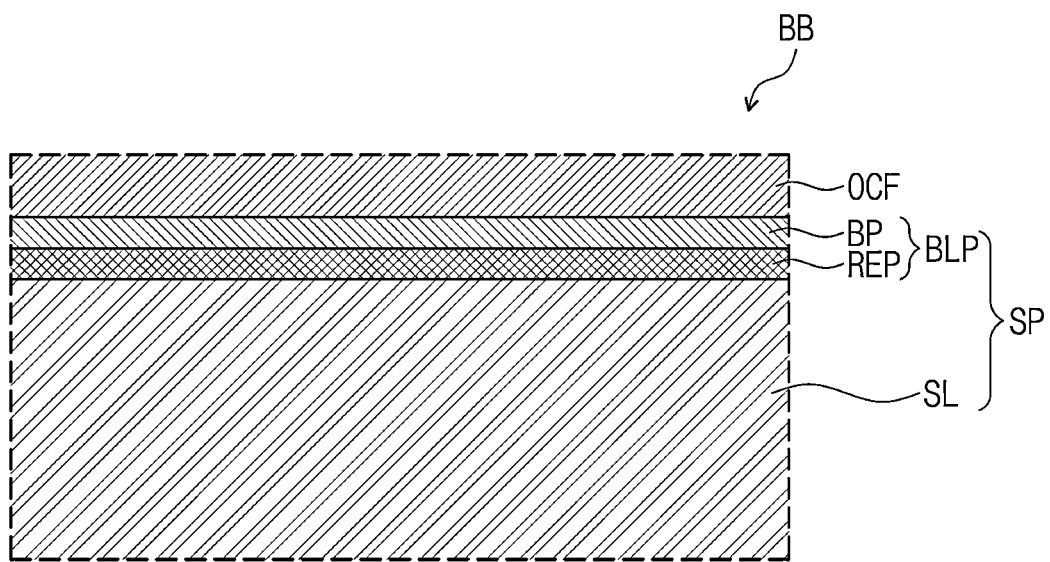
FIG. 7 is an enlarged view of an area BB of FIG. 6.

FIG. 7 is an enlarged view of an area BB of FIG. 6.

Referring to FIG. 7, the support plate SP may include a support layer SL and a shielding layer BLP disposed on the support layer SL. The adhesive layer OCF may be disposed on the shielding layer BLP. The shielding layer BLP may include a light-blocking layer BP and a reflective layer REP disposed between the light-blocking layer BP and the support layer SL.

The support layer SL may include a metal material. In an embodiment, the support layer SL may include stainless steel, aluminum, or any alloys thereof.

The light-blocking layer BP may include a carbon black, a metal material, e.g., chromium (Cr), or the like. Although not shown in drawing figures, the light-blocking layer BP may have a stack structure in which plural colored layers are sequentially stacked one on another. In an embodiment, each colored layer may include an acrylic resin. The colored layers may include a stack structure in which a layer including or consisting of a material used for the colored layer transmitting a red light and a layer including or consisting of a material used for the colored layer transmitting a blue light are stacked. As the colored layer and the light-blocking layer BP commonly include the same material, a manufacturing cost of the display device may be reduced.

Even though a light provided to the display device DD (refer to FIG. 2) from the outside of the display device DD (refer to FIG. 2) is reflected by the support layer SL, the light-blocking layer BP may absorb the reflected light, and thus, the reflected light may be prevented from exiting to the outside of the display panel DP (refer to FIG. 2). In an embodiment, the light-blocking layer BP may absorb a light having a wavelength of a visible light region.

The reflective layer REP may be disposed on the support layer SL. Accordingly, even though stains exist on a surface of the support layer SL, the reflective layer REP may prevent the stains from being perceived through the display panel DP. In an embodiment, the reflective layer REP may have an extinction coefficient higher than that of the light-blocking layer BP. In addition, a thickness of the reflective layer REP may be greater than a thickness of the light-blocking layer BP.

The extinction coefficient is also referred to as an absorption coefficient and is a characteristic that determines how much light a material absorbs at a particular wavelength. The external light incident through the display panel transmits the light-blocking layer BP and then is primarily absorbed according to the extinction coefficient of the light-blocking layer BP. A portion of the light, which is not absorbed by the light-blocking layer BP, becomes partially extinct by the reflective layer REP disposed under the light-blocking layer BP. In this case, when the reflective layer REP includes a material having the extinction coefficient higher than the extinction coefficient of the light-blocking layer BP, a degree of extinction of the light incident into the reflective layer REP may increase.

The light that does not become extinct by the reflective layer REP may be reflected by the support layer SL, and the reflected light may be provided to the reflective layer REP. The light reflected by the support layer SL may become secondarily extinct by the reflective layer REP. Accordingly, the thickness and a value of the extinction coefficient of the reflective layer REP may be an important factor affecting the reflectance of the support plate SP. In the illustrated embodiment, the reflective layer REP may have the extinction coefficient of about 6.03, and the reflective layer REP may have the thickness of about 61 nanometers (nm).

The reflective layer REP may have a relatively high refractive index compared with the light-blocking layer BP. In general, when a light travels from a layer with a relatively high refractive index to a layer with a relatively low refractive index, the light transmittance is high, and when a light travels from a layer with a relatively low refractive index to a layer with a relatively high refractive index, the light transmittance is low. According to this principle, when the reflective layer REP has a refractive index higher than that of the light-blocking layer BP, an amount of the light provided to the support layer SL after transmitting the reflective layer REP may decrease. In an embodiment, the refractive index of the reflective layer REP may vary depending on the extinction coefficient and the thickness of the reflective layer REP within a range where the reflective layer REP has the refractive index higher than that of the light-blocking layer BP.

The reflective layer REP may include a metal material with relatively high reflectance. In an embodiment of the disclosure, the reflective layer REP may include aluminum (Al), however, it should not be limited thereto or thereby. The reflective layer REP may include or consist of at least one metal selected from the group including aluminum, nickel, silver, gold, silicon, titanium, and tantalum.

Figure 8A:
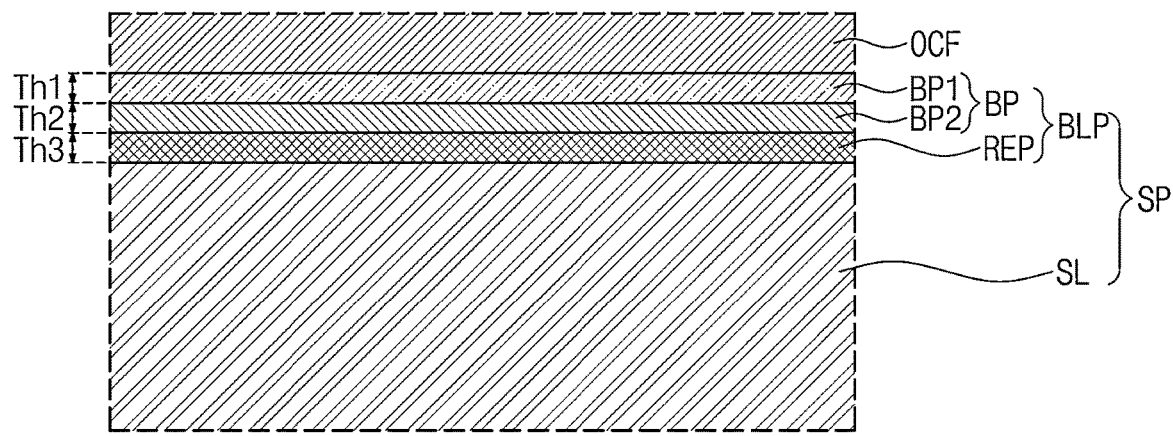
FIG. 8A is an enlarged view of an area BB of FIG. 6.
Figure 8B:
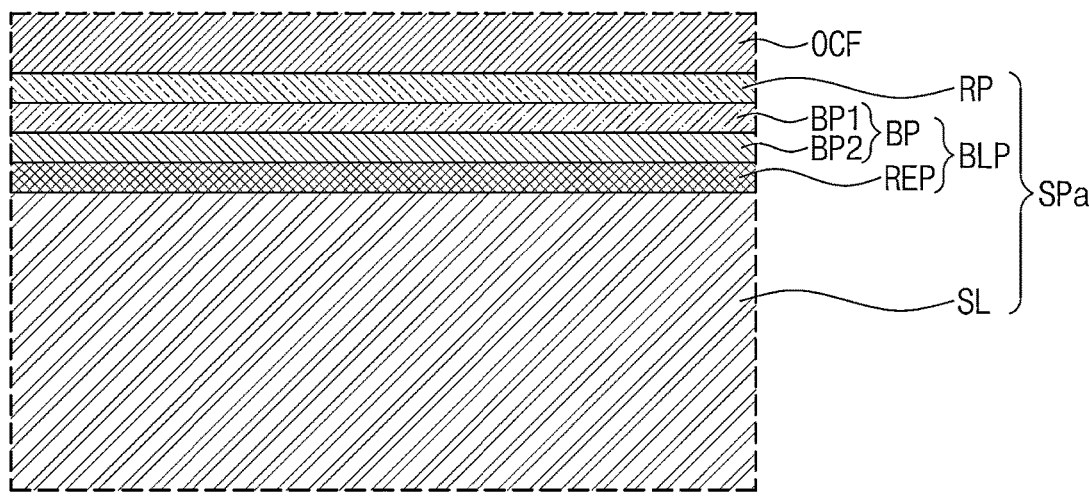
FIG. 8B is an enlarged view of an area BB of FIG. 6.

FIGS. 8A and 8B are enlarged views of areas BB of FIG. 6. In FIGS. 8A and 8B, the same reference numerals denote the same elements in FIG. 7, and thus, detailed descriptions of the same elements will be omitted.

Referring to FIG. 8A, a light-blocking layer BP may include a first absorbing layer BP1 and a second absorbing layer BP2, which are sequentially stacked. The first absorbing layer BP1 may be disposed on the second absorbing layer BP2, and the first absorbing layer BP1 and the second absorbing layer BP2 may have different thicknesses from each other. In an embodiment, the thickness Th1 of the first absorbing layer BP1 may be greater than the thickness Th2 of the second absorbing layer BP2, however, they should not be limited thereto or thereby. In an embodiment, the thickness of the first absorbing layer BP1 may be about 40 nm, and the thickness of the second absorbing layer BP2 may be about 13 nm.

The first absorbing layer BP1 and the second absorbing layer BP2 may include different materials from each other. In an embodiment, the first absorbing layer BP1 may include a polymer material in which a carbon black is dispersed as a black inorganic pigment. The first absorbing layer BP1 may further include a dispersant in addition to the carbon black. In detail, the first absorbing layer BP1 may be used after being surface-treated with the dispersant through the carbon black in advance, or by adding the dispersant together with the carbon black when a composition is prepared.

In an embodiment, the second absorbing layer BP2 may include a metal material having a light-blocking property. The metal material having the light-blocking property may be chromium, for example, however it should not be limited thereto or thereby. The metal material having the light-blocking property may include a chromium compound such as chromium oxide and chromium nitride and an alloy of nickel and tungsten. The second absorbing layer BP2 may have a structure in which multiple layers of metal materials with the light-blocking property are stacked.

The first absorbing layer BP1 may have a refractive index and an extinction coefficient, which are different from those of the second absorbing layer BP2. In an embodiment, the refractive index of the second absorbing layer BP2 may be greater than the refractive index of the first absorbing layer BP1. In addition, the refractive index of the second absorbing layer BP2 may be greater than the refractive index of the reflective layer REP disposed under the second absorbing layer BP2, and thus, the transmittance of the light may be minimized. Accordingly, the external light may be prevented from being perceived by the support plate SP. In an embodiment, the refractive index of the first absorbing layer BP1 may be about 2.35, the refractive index of the second absorbing layer BP2 may be about 3.41, and the refractive index of the reflective layer REP may be about 0.83.

In an embodiment, the extinction coefficient of the second absorbing layer BP2 may be greater than the extinction coefficient of the first absorbing layer BP1. The second absorbing layer BP2 may absorb remaining external light after the first absorbing layer BP1 blocks the external light. The extinction coefficient of the second absorbing layer BP2 may be set to about 1.5 or more to absorb the remaining external light. The extinction coefficient of the reflective layer REP may be greater than the extinction coefficient of the second absorbing layer BP2. The extinction coefficient value may increase as a metal component increases in the material. As the extinction coefficient of the reflective layer REP becomes larger than that of the second absorbing layer BP2, almost no transmission occurs, and only and mostly a surface reflection occurs. Therefore, the external light remaining after the external light is reflected by the reflective layer REP may be absorbed by the first absorbing layer BP1 and the second absorbing layer BP2 again, and thus, it is possible to prevent the external light from being viewed from outside due to the reflection in the display panel DP. In an embodiment, the extinction coefficient of the first absorbing layer BP1 may be about 0.83, the extinction coefficient of the second absorbing layer BP2 may be about 2.12, and the extinction coefficient of the reflective layer REP may be about 6.03.

In an embodiment, the thickness (a sum of the thickness Th1 and the thickness Th2) of the light-blocking layer BP may be smaller than the thickness Th3 of the reflective layer REP. In detail, the thickness of the light-blocking layer BP may be about 53 nm, and the thickness of the reflective layer REP may be about 61 nm.

A support plate SPa of FIG. 8B may further include a protective layer RP compared with the support plate SP of FIG. 8A. The protective layer RP may protect a shielding layer BLP and may be disposed between the shielding layer BLP and an adhesive layer OCF.

The protective layer RP may include oxide. The protective layer RP may include oxide to protect a surface of the shielding layer BLP. In an embodiment, the protective layer RP may include silicon oxide (SiO2). Silicon oxide (SiO2) may be provided in a thin film that prevents a movement of charge carriers in an element to provide an insulation property at a predetermined level. Accordingly, the protective layer RP may serve as an insulating layer and may protect the surface of the shielding layer BLP to prevent an organic material from entering to the shielding layer BLP. However, the disclosure should not be limited thereto or thereby, and the protective layer RP may include aluminum oxide (AL2O3) as the oxide.

In an embodiment, when the protective layer RP includes silicon oxide (SiO2), the protective layer RP may be strongly attached to the adhesive layer OCF since silicon oxide (SiO2) has excellent adhesion. Accordingly, in the case where the protective layer RP is provided to the support plate SPa, a cohesion between the support plate SPa and the adhesive layer may be improved.

The protective layer RP may have a refractive index similar to a refractive index of the adhesive layer OCF. The refractive index of the adhesive layer OCF may be about 1.5. In the case where the protective layer RP includes silicon oxide (SiO2), the refractive index of the adhesive layer OCF may be about 1.46.

Figure 9:
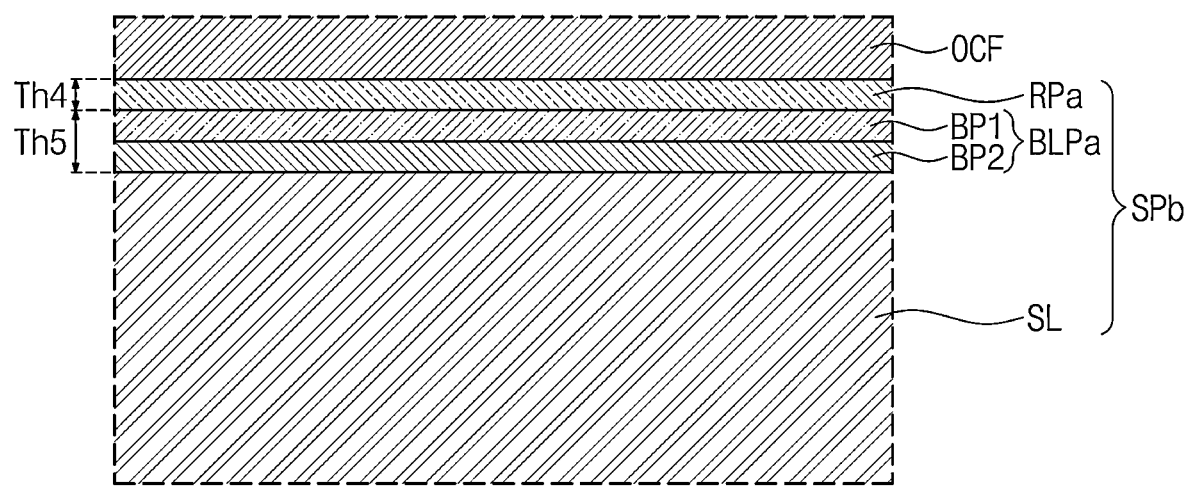
FIG. 9 is an enlarged view of an area BB of FIG. 6.

FIG. 9 is an enlarged view of an area BB of FIG. 6.

Referring to FIG. 9, a support plate SPb may include a support layer SL, a shielding layer BLPa disposed on the support layer SL, and a protective layer RPa disposed on the shielding layer BLPa. An adhesive layer OCF may be disposed on the protective layer RPa. The support plate SPb of FIG. 9 may have a structure from which the reflective layer REP of the support plate SPa of FIG. 8A is omitted. That is, the shielding layer BLPa may include first and second absorbing layers BP1 and BP2.

The shielding layer BLPa may include the first absorbing layer BP1 and the second absorbing layer BP2, which are sequentially stacked. The first absorbing layer BP1 may be disposed on the second absorbing layer BP2, and the first absorbing layer BP1 and the second absorbing layer BP2 may have different thicknesses from each other. In an embodiment, the thickness of the first absorbing layer BP1 may be greater than the thickness of the second absorbing layer BP2, however, they should not be limited thereto or thereby. In an embodiment, the thickness of the first absorbing layer may be about 30 nm, and the thickness of the second absorbing layer may be about 10 nm, for example.

The first absorbing layer BP1 and the second absorbing layer BP2 may include different materials from each other. In an embodiment, the first absorbing layer BP1 may include a polymer material in which a carbon black is dispersed as a black inorganic pigment. The first absorbing layer BP1 may further include a dispersant in addition to the carbon black. In detail, the carbon black may be used after being surface-treated with the dispersant in advance, or the dispersant may be added together with the carbon black when a composition is prepared.

In an embodiment, the second absorbing layer BP2 may include a metal material having a light-blocking property. The metal material having the light-blocking property may be chromium, for example, however it should not be limited thereto or thereby. The metal material having the light-blocking property may include a chromium compound such as chromium oxide and chromium nitride, and an alloy of nickel and tungsten. The second absorbing layer BP2 may have a structure in which multiple layers of metal materials with the light-blocking property are stacked.

The protective layer RPa may protect the shielding layer BLPa and may be disposed between the shielding layer BLPa and the adhesive layer OCF. The protective layer RPa may include oxide. The protective layer RPa may include oxide to protect a surface of the shielding layer BLPa. In an embodiment, the protective layer RPa may include titanium oxide (TiO2). Titanium oxide (TiO2) may protect the surface of the shielding layer BLPa to prevent an organic material from entering to the shielding layer BLPa.

A thickness Th4 of the protective layer RPa may be greater than a thickness Th5 of the shielding layer BLPa. In detail, the thickness of the protective layer RPa may be about 22 nm, and the thickness of the shielding layer BLPa may be about 40 nm.

According to a conventional display device, an image quality of the display panel DP is deteriorated due to a relatively high reflectance of the support plate SP, the external light is reflected by components of the display device, and the reflected light is viewed. To prevent the reflection of the external light, a separate cover tape (C-Panel) is added, however, the cover tape includes two adhesive layers and a PI barrier and the manufacturing cost of the cover tape is high. According to the disclosure, the cover tape may be replaced with the shielding layer BLPa and the protective layer RPa, and thus, the thickness of the electronic device ED (refer to FIG. 1) may be reduced, and a manufacturing cost may decrease.

Figure 10:
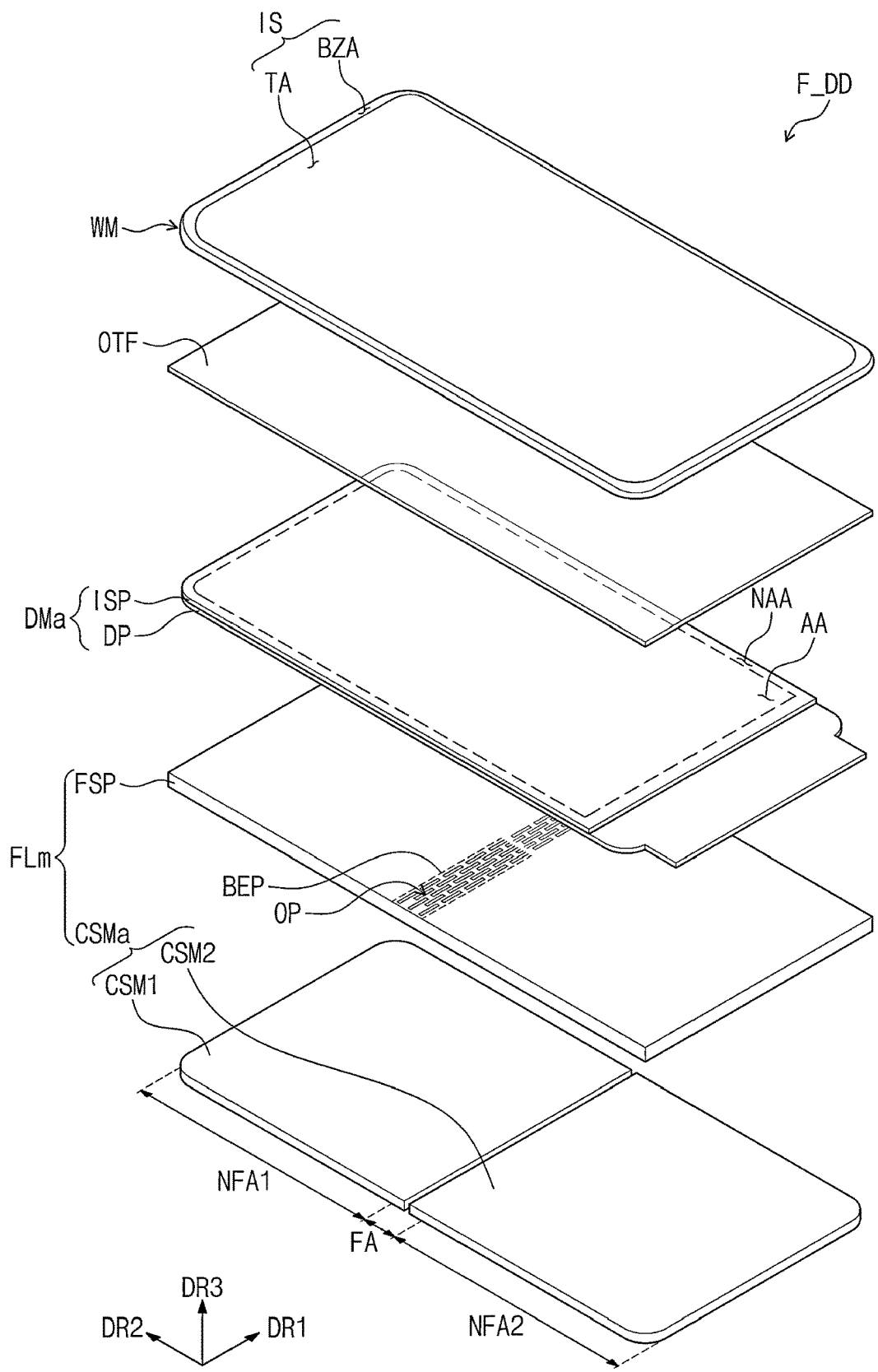
FIG. 10 is an exploded perspective view of an embodiment of a display device according to the disclosure.

FIG. 10 is an exploded perspective view of an embodiment of a display device F_DD according to the disclosure. In FIG. 10, the same reference numerals denote the same elements in FIG. 2, and thus, detailed descriptions of the same elements will be omitted.

Referring to FIG. 10, the display device F_DD may include a display module DMa displaying an image, an upper module disposed on the display module DMa, and a lower module disposed under the display module DMa. The display module DMa may serve as a component and may generate the image.

The display module DMa may include a display panel DP and an input sensing layer ISP. The display panel DP may be a flexible display panel. The display panel DP may include a folding area FA and non-folding areas NFA1 and NFA2. Accordingly, the display panel DP may be entirely rolled or may be folded or unfolded with respect to a folding axis.

The upper module may include a window WM disposed on the display module DM. The window WM may include an optically transparent insulating material. Accordingly, the image generated by the display module DM may be viewed to the user after passing through the window WM. The upper module may further include an optical film OTF disposed between the display module DM and the window WM.

The lower module FLm may include a support plate FSP disposed under the display module DMa and a cover support plate CSMa disposed under the support plate FSP. The cover support plate CSMa may include cover support plates CSM1 and CSM2 in the number corresponding to the number of the non-folding areas NFA1 and NFA2. In an embodiment, the cover support plate CSMa may include a first cover support plate CSM1 and a second cover support plate CSM2 disposed spaced apart from the first cover support plate CSM1.

The first and second support plates CSM1 and CSM2 may be disposed to respectively correspond to the first and second non-folding areas NFA1 and NFA2. The first cover support plate CSM1 may be disposed to correspond to the first non-folding area NFA1 of the display module DM, and the second cover support plate CSM2 may be disposed to correspond to the second non-folding area NFA2 of the display module DM. In addition, the support plate FSP may be disposed to overlap the non-folding areas NFA1 and NFA2.

The support plate FSP may be disposed on a rear surface of the display panel DP and may support the display panel DP. The support plate FSP may be a protective plate that absorbs external impacts applied thereto from the outside or prevents a foreign substance or moisture from entering the display panel DP to protect the display panel DP.

Although not shown in FIG. 10, the support plate FSP may include a support layer SL and a shielding layer BLP disposed on the support layer SL as shown in FIG. 7. An adhesive layer OCF may be disposed on the shielding layer BLP. The shielding layer BLP may include a light-blocking layer BP and a reflective layer REP disposed between the light-blocking layer BP and the support layer SL. Hereinafter, descriptions of the same elements as those of FIG. 6 will be omitted.

The support plate FSP may include a bending portion BEP corresponding to the folding area FA. A plurality of patterns OP may be provided to the bending portion BEP. The patterns OP may be arranged at predetermined intervals in the bending portion BEP. The patterns OP may be arranged in a zigzag shape. In addition, each of the patterns OP may be an opening pattern defined through the support plate FSP, however, the disclosure should not be limited thereto or thereby. That is, each of the patterns OP may be a groove pattern recessed from an upper or lower surface of the support plate FSP. Each of the patterns OP may have a quadrangular shape extending in the first direction DR1 along the folding area FA. However, the shape of the patterns OP should not be limited thereto or thereby. In an embodiment, each of the patterns OP may have a lozenge shape or a circular shape.

As the patterns OP are provided to the bending portion BEP, a flexibility of the bending portion BEP may increase. The support plate FSP may support the display module DMa and may facilitate the folding of the display device F_DD.

Although the embodiments of the disclosure have been described, it is understood that the disclosure should not be limited to these embodiments but various changes and modifications may be made by one ordinary skilled in the art within the spirit and scope of the disclosure as hereinafter claimed. Therefore, the disclosed subject matter should not be limited to any single embodiment described herein, and the scope of the inventive concept shall be determined according to the attached claims.

What is claimed is:

1. An electronic device comprising:
a display panel which displays an image;
a support plate supporting the display panel; and an adhesive layer disposed between the display panel and the support plate, the support plate comprising:
   a support layer including a metal material; and
   a shielding layer disposed on the support layer, the shielding layer comprising:
      a light-blocking layer; and
      a reflective layer disposed between the light-blocking layer and the support layer,
   wherein an edge of the support layer corresponds to an edge of the shielding layer in a plan view.

2. The electronic device 1, wherein the light-blocking layer comprises a first absorbing layer and a second absorbing layer, which are sequentially stacked, and the first absorbing layer and the second absorbing layer comprise different materials from each other.

3. The electronic device 2, wherein the first absorbing layer has a thickness greater than a thickness of the second absorbing layer in a thickness direction.

4. The electronic device 1, wherein the reflective layer has an extinction coefficient greater than an extinction coefficient of the light-blocking layer.

5. The electronic device 2, wherein the second absorbing layer has an extinction coefficient greater than an extinction coefficient of the first absorbing layer.

6. The electronic device 3, wherein the reflective layer has an extinction coefficient greater than an extinction coefficient of the second absorbing layer.

7. The electronic device 1, wherein the reflective layer has a thickness greater than a thickness of the light-blocking layer in a thickness direction, and the reflective layer has a refractive index smaller than a refractive index of the light-blocking layer.

8. The electronic device 1, wherein the reflective layer comprises a metal material and has a reflectance higher than a reflectance of the light-blocking layer.

9. The electronic device 1, wherein the support plate further comprises a protective layer disposed between the shielding layer and the adhesive layer.

10. The electronic device 9, wherein the protective layer has an extinction coefficient smaller than an extinction coefficient of the shielding layer, and the protective layer has a refractive index smaller than a refractive index of the adhesive layer.

11. The electronic device 10, wherein the protective layer comprises an oxide.

12. The electronic device 11, wherein the protective layer has a thickness greater than a thickness of the shielding layer in a thickness direction.

13. The electronic device 1, wherein the display panel comprises a folding area and a non-folding area, and the non-folding area comprises a first non-folding area and a second non-folding area.

14. The electronic device 13, wherein the support plate overlaps the first non-folding area and the second non-folding area.

15. An electronic device comprising:
   a display panel which displays an image;
   a support plate supporting the display panel; and
   an adhesive layer disposed between the display panel and the support plate, the support plate comprising:
      a support layer including a metal material;
      a shielding layer disposed on the support layer; and
      a protective layer disposed between the shielding layer and the adhesive layer,
   wherein an edge of the support layer corresponds to an edge of the shielding layer in a plan view.

16. The electronic device 15, wherein the protective layer comprises an oxide.

17. The electronic device 15, wherein the shielding layer comprises a first absorbing layer and a second absorbing layer, and the first absorbing layer and the second absorbing layer comprise different materials from each other.

18. The electronic device 17, wherein the shielding layer further comprises a reflective layer disposed between the second absorbing layer and the support layer.

19. The electronic device 18, wherein the reflective layer has an extinction coefficient greater than an extinction coefficient of the second absorbing layer.

* * * * *